US010225897B2

(12) United States Patent
Beghelli

(10) Patent No.: US 10,225,897 B2
(45) Date of Patent: Mar. 5, 2019

(54) MULTIFUNCTION ELECTRONIC POWER SUPPLY FOR LED LIGHTING APPLIANCES

(71) Applicant: Beghelli S.p.A., Monteveglio-Valsamoggia (IT)

(72) Inventor: Gian Pietro Beghelli, Monteveglio-Valsamoggia (IT)

(73) Assignee: Beghelli S.p.A., Monteveglio-Valsamoggia (IT)

( * ) Notice: Subject to any disclaimer, the term of this patent is extended or adjusted under 35 U.S.C. 154(b) by 0 days.

(21) Appl. No.: 15/838,762

(22) Filed: Dec. 12, 2017

(65) Prior Publication Data

US 2018/0116020 A1 Apr. 26, 2018

Related U.S. Application Data

(63) Continuation of application No. PCT/IT2016/000153, filed on Jun. 13, 2016.

(30) Foreign Application Priority Data

Jun. 12, 2015 (IT) .......................... 102015000023279

(51) Int. Cl.
*H05B 33/08* (2006.01)
*H03K 17/74* (2006.01)
(Continued)

(52) U.S. Cl.
CPC ......... *H05B 33/0815* (2013.01); *H03K 17/74* (2013.01); *H03K 17/941* (2013.01);
(Continued)

(58) Field of Classification Search
CPC ............ H05B 33/0815; H05B 37/0281; H05B 37/0218; H05B 37/0227; H05B 37/0245;
(Continued)

(56) References Cited

U.S. PATENT DOCUMENTS 7,719,246 B2 * 5/2010 Melanson ........... H02M 1/4225
323/282
2010/0176742 A1 7/2010 Lee
(Continued)

FOREIGN PATENT DOCUMENTS

WO 2010031169 A1 3/2010

OTHER PUBLICATIONS

International Search Report and Written Opinion dated Oct. 13, 2016 from corresponding International Application No. PCT/IT2016/000153 (13 pages).
(Continued)

*Primary Examiner* — Tung X Le
*Assistant Examiner* — Henry Luong
(74) *Attorney, Agent, or Firm* — Maier & Maier, PLLC

(57) ABSTRACT

A multifunction electronic power supply for LED lighting appliances. A series of interface ports or connectors, a block for filtering and measuring the voltage and current, connected to the main power supply, an auxiliary power supply, a microcontroller, a flyback converter with isolated output, a circuit for measuring the brightness, a light sensor, which detects the light reflected from the floor and from the objects and/or people present in the area which is illuminated by the lighting appliance, and a LED light source of the lighting appliance, which spreads light in the environment and which is driven by the electronic power supply.

9 Claims, 5 Drawing Sheets

(51) Int. Cl.
*H03K 17/94* (2006.01)
*H05B 37/02* (2006.01)

(52) U.S. Cl.
CPC . *H05B 37/0281* (2013.01); *H03K 2217/0027* (2013.01); *H03K 2217/0081* (2013.01); *H05B 37/0218* (2013.01); *H05B 37/0227* (2013.01); *H05B 37/0245* (2013.01)

(58) Field of Classification Search
CPC ............... H03K 17/74; H03K 17/941; H03K 2217/0027; H03K 2217/0081
See application file for complete search history.

(56) References Cited

U.S. PATENT DOCUMENTS

| | | | |
|---|---|---|---|
| 2010/0262297 A1 | 10/2010 | Shloush et al. | |
| 2011/0204820 A1* | 8/2011 | Tikkanen | H05B 33/0815 315/294 |
| 2013/0127362 A1* | 5/2013 | Trainor | H02J 9/065 315/224 |
| 2014/0028211 A1* | 1/2014 | Imam | H02M 3/33507 315/200 R |
| 2015/0163867 A1* | 6/2015 | Recker | H02J 9/02 315/250 |

OTHER PUBLICATIONS

Italian Search Report and Office Action dated Mar. 1, 2016 from corresponding Italian Application No. UB20151310 (83 pages).

\* cited by examiner

MULTIFUNCTION ELECTRONIC POWER SUPPLY FOR LED LIGHTING APPLIANCES

CROSS-REFERENCE

This is a continuation of International Application PCT/IT2016/000153, with an international filing date of Jun. 13, 2016, the contents of which are hereby incorporated by reference in their entirety.

FIELD

This invention relates, in general, to a multifunction electronic power supply for LED lighting appliances.

BACKGROUND

The introduction of LEDs on the market has opened new functional potentials in the lighting engineering sector.

The versatility of these new light sources allows the light to be managed dynamically according to new methods, which is inconceivable with the traditional light sources.

The need therefore emerges for the manufacturers of lighting appliances to be provided with power supplies for LEDs which are versatile, multipurpose, easily reconfigurable, even by the users, controllable with wireless interfaces and low cost, to increase the relative competitive advantage.

SUMMARY

The aim of this invention is to provide a multifunction electronic power supply for LED lighting appliances which is able to independently control a LED type light source.

Another aim of this invention is to provide a multifunction electronic power supply for LED lighting appliances which is set up for the auto-regulation of luminosity, remote wireless control, automatic management of switching ON as a function of the presence of people, management of cameras and, optionally, for the emergency lighting function.

These and other aims, according to this invention, are achieved by providing a multifunction electronic power supply for LED lighting appliances, according to appended claim 1; further detailed embodiments are described in the dependent claims.

Advantageously, the new multifunction electronic power supply according to this invention is made in a basic version with minimum functionalities which can be progressively expanded by adding specific modules.

The manufacturer of lighting appliances therefore has the advantage of being able to set up its entire range of LED lighting appliances with a power supply which is versatile, low cost, set up for all the most complex functions and which can be easily updated (even, if necessary, by the customer), by adding suitable specific functional modules.

BRIEF DESCRIPTION

Further characteristics and advantages of a multifunction electronic power supply for LED lighting appliances, according to the invention, will more fully emerge from the description that follows, relative to a preferred embodiment thereof given by way of non-limiting example, and from the appended drawings, in which.

DETAILED DESCRIPTION

Figure 1:
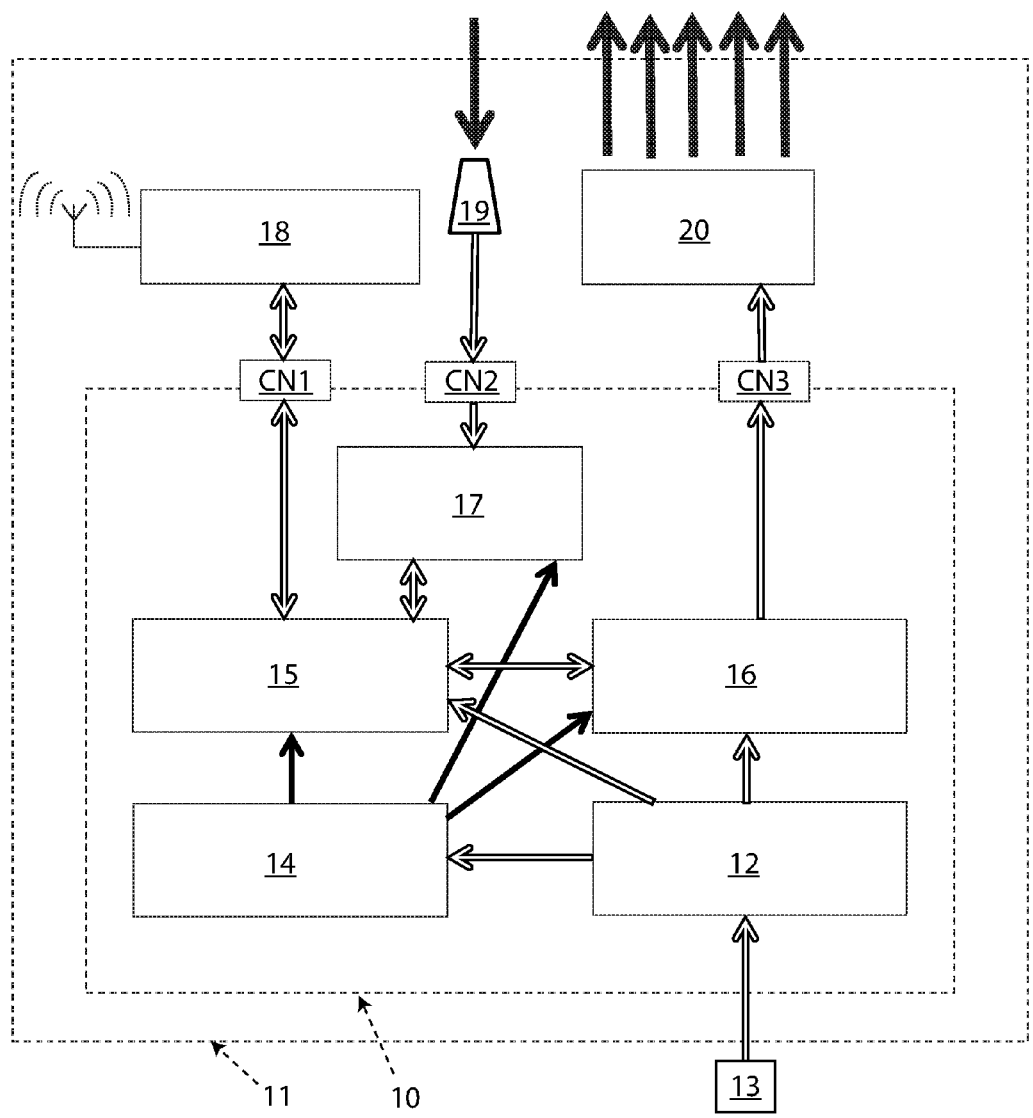
FIG. 1 is a block diagram of a first embodiment of the multifunction electronic power supply for LED lighting appliances according to the invention.

With particular reference to the above-mentioned FIG. 1, which illustrates a block diagram of a basic version of the new multifunction electronic power supply, according to the invention, the electronic power supply 10 is incorporated in a LED lighting appliance 11 with a series of functional ports or connectors CN1, CN2, CN3.

The electronic power supply 10 also comprises a block 12, connected to the 230 Volt AC mains power supply 13, which includes a series of input filters and interfaces for measuring current and voltage, an auxiliary power supply 14, a microcontroller 15, a flyback converter having an isolated output 16 and a circuit for measuring the brightness 17.

Moreover, the ports CN1, CN2, CN3 are connected, respectively, to a digital radio transceiver 18 of the FH-DSSS type and/or other specific devices of the lighting appliance 11, to a light sensor 19 of the lighting appliance 11, which detects the light reflected from the floor and from the objects and/or people present in the area which is illuminated, and to a LED light source 20 of the lighting appliance 11, which spreads light in the environment.

In the basic version, illustrated in FIG. 1, only the connector CN3 is connected and the electronic power supply 10 controls the LED light source 20 regulating a constant predetermined power for the lighting appliance 11 in which the above-mentioned electronic power supply 10 is inserted.

The electronic power supply 10, in all the versions illustrated, incorporates the function of measuring the power absorbed by the mains power supply and metering the energy consumed during the life of the product; this measurement is always available as an internal metering variable and may be read by means of the CN1 interface port or connector.

The electronic power supply 10 is configured in the factory by means of the CN1 interface connector at the time of assembling in the lighting appliance 11.

At that time, a suitable external configuration apparatus, communicating with the microcontroller 15 by means of the CN1 connector, writes the configuration parameters of the power supply 10 in the permanent memory of the microcontroller 15.

In this way, the power supplies 10 are all manufactured the same in the factory and configured for each different type of lighting appliance 11 only at the time of construction of the appliance 11 itself.

Once the electronic power supply 10 is inserted in the lighting appliance 11 a series of possible options may be added, if necessary by the client, such as the following:

use of a light sensor 19; in effect, by connecting a light sensor 19 to the port CN2 the power supply 10 automatically recognises the presence and automatically activates a mode for auto-regulating the luminosity emitted as a function of the reflected light measured according to auto-calibration and auto-regulation algorithms already protected by the same Applicant;

use of a radio transceiver 18; the port CN1 is designed for connecting a radio transceiver module 18, which is powered by the CN1 port itself. In that case, the electronic power supply 10 automatically recognises the presence of the transceiver 18 and makes its functions available, in such a way that the radio transceiver module 18 can fully control the lighting appliance 11 reading all the status variables and controlling the operational statuses and in particular the switching ON/OFF status, the level of luminosity emitted, the operational mode, etc.;

as an alternative to the radio transceiver module 18 it is possible to connect a 0/10 Volt analogue interface module to the CN1 port which allows the level of luminosity of the light source LEDs 20 to be controlled by means of an external voltage;

again as an alternative to the previous modules, it is possible to connect to the CN1 port an interface module towards the field buses (for example, DALI, MODBUS, etc.), which displays to the external port the protocol of the bus identified; with this interface it is possible to control the power supply 10 from the outside according to the functions allowed by the relative standard (e.g. DALI);

as an alternative to the other modules described above, it is also possible to connect to the CN1 port a sensor for the detection of movement or the presence of people, which is able to provide to the power supply 10 details on the presence of people or vehicles in the area illuminated in order to actuate suitable energy saving strategies (for example, reduction of the lighting in the absence of people or vehicles) or accentuation of the lighting in the presence of certain events;

lastly, it is possible to connect to the CN1 port, if necessary together with the radio transceiver 18, a camera which is able to capture images in the illuminated area and communicate with the power supply 10 to inform it of the dynamics present in the area (movement of people, vehicles, etc.) and therefore actuate strategies similar to those described above, but with a greater spatial resolution (for example, by using the camera it is possible to define areas of the image in which the detection of movement increases the light intensity and other areas of the image in which the movement does not determine any event; moreover, the camera, if connected to the radio transceiver module 18, is able to remotely send the images of the area in question).

Figure 2:
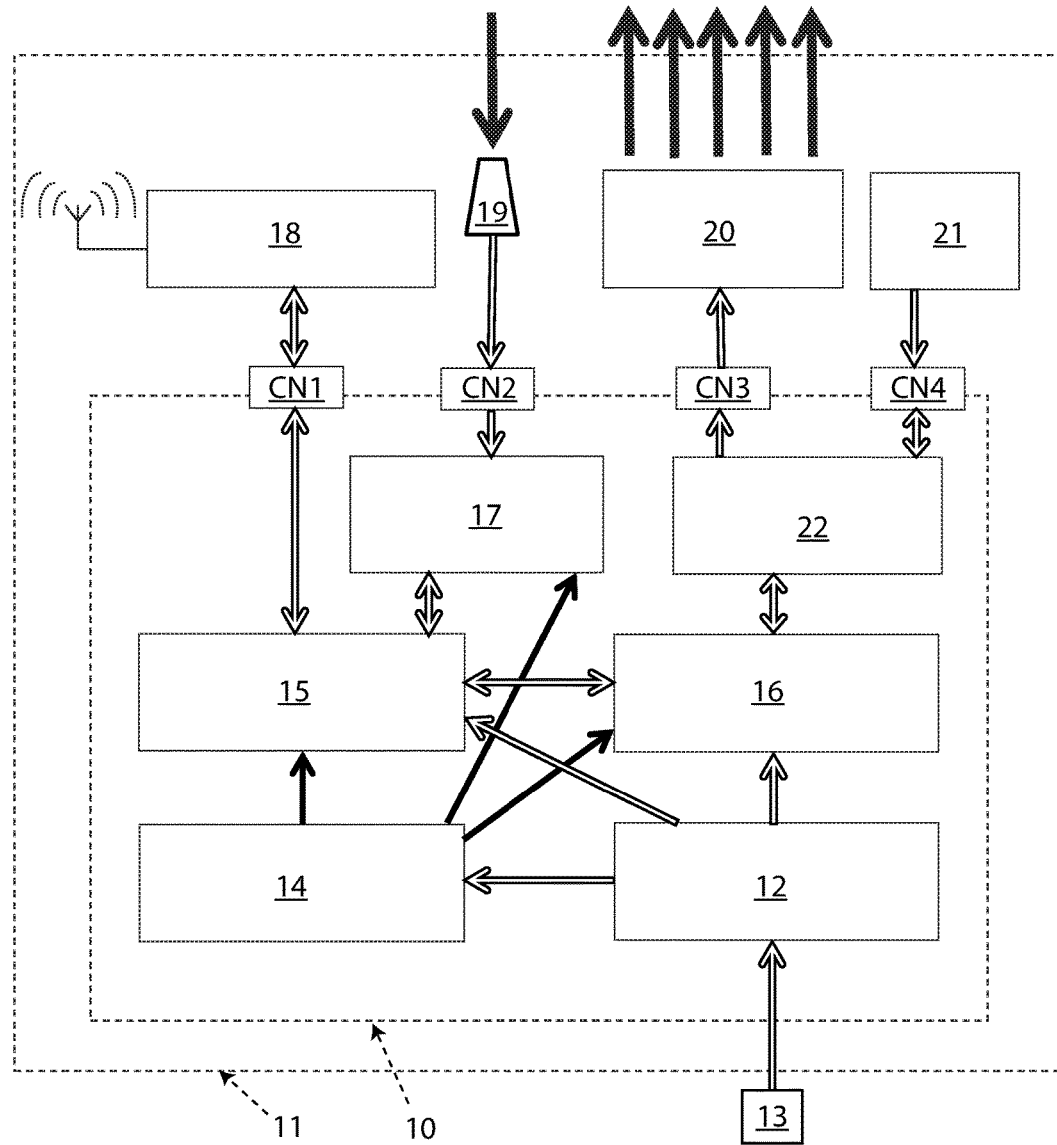
FIG. 2 is a block diagram of a further embodiment of the multifunction electronic power supply for LED lighting appliances according to the invention.

With particular reference to FIG. 2, which illustrates a block diagram of a possible variant embodiment of the multifunction electronic power supply of FIG. 1, there is a further port or connector CN4, which allows a battery 21 to be connected for activating an emergency lighting function, by use of specific control circuits 22 of the emergency function.

In this second embodiment of the power supply 10, connecting a battery 21 with suitable features, the power supply 10 automatically controls the emergency lighting function, in such a way that, in the event of a power failure, the LED light source 20 is powered by the power supply 10 with reduced power, thanks to the energy accumulated in the battery 21 and according to the typical methods of the emergency lighting appliances.

More specifically, according to a possible interesting emergency function, the power supply 10 is connected permanently to the mains power supply 13 and the command for switching the light ON/OFF is performed by means of the connection or interface port CN1, using the radio transceiver 18 or by using a field bus interface module (DALI, MODBUS, etc.); the light is therefore controlled by the user via a logic command which is sent to the power supply 10.

In this way, the emergency function activates correctly when there is an electrical power failure at the connection terminals to the 230V AC mains power supply 13; this guarantees that the battery 21 is kept charged continuously even when the light is switched OFF and the evident system advantage, especially if the radio interface 18 is used, is the absence of dedicated AC electrical lines for the emergency function.

With regard to the auto-regulation function of the light emitted, where the power supply described is equipped with the light sensor 19, as already described in other patent documents in the name of the same Applicant, the electronic power supply 10, as soon as it is installed, activates an automatic procedure for auto-calibration of the light sensor 19, which allows the lighting appliance 11 to adapt to the lighting characteristics of the context in which it is positioned; in particular, the appliance 11 measures the light reflected by the from the floor and from the illuminated objects and, on the basis of this measurement, the regulating is performed, the aim of which is to keep constant over time the above-mentioned quantity of reflected light.

Since the reflected light is the sum of the light projected on the floor by the lighting appliance 11 and the natural light present in the environment, coming, for example, from windows and skylights ($L_{reflected} \approx L_{appliance} + L_{environment}$), it is evident that keeping the sum constant is equivalent to automatically reducing the light emitted by the LED light source 20 when the ambient light increases.

The lighting appliance 11 may also incorporate the adaptive auto-calibration function already described above and already the subject of other patents by the same Applicant.

Figure 3:
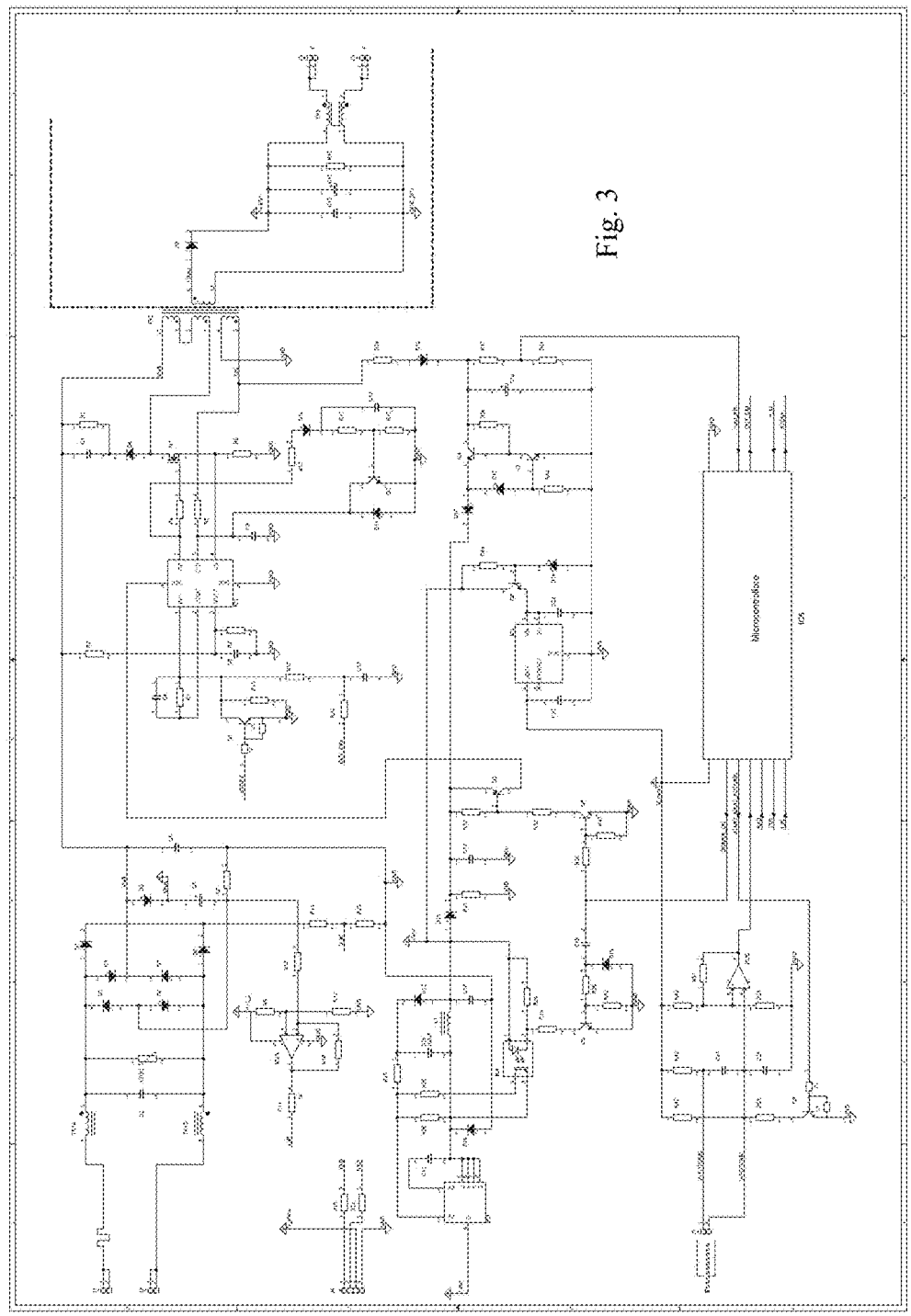
FIG. 3 shows a circuit diagram of the multifunction electronic power supply for LED lighting appliances of FIG. 1, according to the invention.

FIG. 3 illustrates a basic circuit diagram of the multifunction electronic power supply of FIG. 1, according to a first embodiment of the invention. More specifically, the circuit shown in FIG. 3 comprises the following functional blocks.

Block 12, which includes the input filters and the voltage and current measurement interfaces, comprises the components TR1, C2, VDR1, D1, D2, D3, D5, D6, D7, D9, C6, the operational amplifier IC2A, complete with its auxiliary components, and the measurement divider R14, R23.

This produces the signals for measurement of the input current I_IN and the input voltage V_IN, which are connected to suitable A/D inputs of the microcontroller 15; moreover, the block 12 provides the rectified voltage Vrail, with positive sinusoidal arcs, which constitutes the input of the flyback converter 16 and the continuous voltage Vbus, which constitutes the input of the auxiliary power supply 14.

The auxiliary power supply 14 includes the switching power supply IC3, which, together with its auxiliary components, generates the voltage Vaux starting from the rectified mains voltage Vbus; this power supply is of the extremely low power standby type and absorbs less than 200 mW from the mains power supply 13 on standby.

The output voltage Vaux is determined by the divider consisting of the resistors R26, R28 and R29.

In standby conditions, the opto-isolator IC24 is "OFF" and the resistor R29 is therefore disconnected from the divider; consequently, the voltage Vaux adopts a "low" value of approximately 5V.

Using Q8 and IC5, Vaux powers the microcontroller 15, with the voltage V_micro, equal to approximately 3V; in this way, the microcontroller 15 is fully operational, with the power supply 14 in standby, thanks to this power supply and the same power supply is carried to the port or connector CN1 (J4) to power the external modules (V_micro); in these conditions, the entire power supply 10, with the flyback converter 16 switched OFF, absorbs less than 200 mW from the mains power supply 13 and is fully operational.

The auxiliary power supply 14 also include the switches Q5, Q3, Q6 and the regulator Q4 with their boundary components.

When the microcontroller 15 decides to switch ON the LED light source 20 it must activate the flyback converter 16; this action is carried out advantageously by activating the DRIVER_ON pin, which provides a pulse to Q5 and to IC4 placing in parallel to each other the resistors R29 and R28, thus causing the temporary increase of the Vaux to approximately 15V and switching ON simultaneously and stably Q3, which supplies power to the controller 1C1 of the flyback converter 16.

As soon as the flyback converter 16 starts to operate, the auto-powering voltage localises on the Zcd winding of TR2 which, limited in amplitude by the voltage regulator Q4, Q7, supplies the correct voltage of approximately 15V to the controller IC1, buffering the temporary increase of Vaux (which runs out in a short time following the discharging of the capacitor C19).

So the flyback converter 16 auto-powers itself soon after the relative start-up by means of Zcd, Q4 and Q3 and, after the flyback converter 16 has started, the microcontroller 15 and the other parts powered at 3V are stably powered by IC3 at the lowest possible voltage of approximately 5V.

In this way, advantageously, the circuits described, controlled by the microcontroller 15, always guarantee the lowest possible power consumptions during every operational phase, dynamically regulating the operational voltages; this management is carried out in a favourable manner with extremely low cost components and with particularly simple circuit design solutions.

The flyback converter 16 comprises the MOSFET power transistor M1, the output diode D8 and the transformer TR2, whilst the controller IC1 of the flyback converter 16 is complete with the passive components R2, R7, C8, R3, C4, R4 and R5; moreover, the flyback converter 16 also includes the snubber network D4, C1, R1, the phase correction network R12, D10, R21, R27, C13, Q2, D11, C9 and the current measurement resistor R9.

Moreover, the flyback converter 16 interfaces with the microcontroller 15 by means of the passive networks connected to the OUT_DIM and STDBY (R10, Q1, R15, R24 and C12) signals and the IC1 controller incorporates a multiplier connected with the MULT pin to the rectified network input voltage, following the temporal trend to shape the envelope of the average current absorbed by the flyback converter 16, so as to absorb sinusoidal current from the network.

The amplitude of the other input of the multiplier is determined by the voltage present at the terminals of C12 which is carried to the INV and COMP pins of IC1; the amplitude of the voltage at the terminals of C12 therefore determines the average intensity of the current absorbed by the flyback converter 16 and therefore the relative output power.

The output circuit of the flyback converter 16 comprises D8, C10 and C11 and the anti-disturbance filter TR3 to which are connected the light source LEDs 20 by connector J3, J5 (port CN3).

The phase correction network consisting of R12, D10, R21, R27, C13, Q2, D11, C9 constitutes an important element for reducing the electromagnetic disturbances produced by the flyback converter 16, especially in certain operational states; this represents a simple circuit design innovation, carried out with extremely low cost components and which is also able to advantageously reduce the complexity of the power anti-disturbance filters (TR1, C2, ... ).

In fact, when the output power of the converter 16 is low, at the instants in time when the mains voltage is high, the controller IC1, in the absence of the phase correction network, would easily tend to operate at particularly high frequency regimes (hundreds of kHz) producing annoying electromagnetic disturbances and onerous filtering problems.

The above-mentioned network avoids this phenomena since the capacitor C13, instantaneously charging at the switching ON of M1, determines with the charge accumulated a minimum delay of reactivation of M1; in effect, Q2 releases the ZCD pin of the controller IC1 only after the discharging delay of C13, imposing a minimum limit to the Toff of the flyback converter 16 and therefore limiting the maximum frequency at which the flyback converter 16 can operate.

The microcontroller 15 completely governs the operation of the entire power supply 10; in particular, the DRIVER_ON and STDBY pins control the switching ON/OFF of the flyback converter 16 and V_IN and I_IN are the A/D inputs for measuring input voltage and current.

Vout_MIS, connected to another A/D input of the microcontroller 15, allows measurement of the output supply voltage of the LEDs of the light source 20, by means of the voltage reflected by the transformer TR2.

The Vout_MIS pin is also connected to a comparator inside the microcontroller 15, which, by means of a microprogrammed internal flip-flop logic, instantaneously blocks the control outputs of the flyback converter 16 if a pre-set threshold is exceeded, intervening as protection of the entire power supply 10 if the LEDs of the light source 20 are disconnected from the output.

The output power of the flyback 16 and, therefore, the intensity of the light emitted by the LED light source 20 is controlled by the OUT_DIM pin, on which the microcontroller 15 generates a high frequency PWM signal, the duty-cycle D of which is proportional to the desired intensity.

This signal is filtered by the network R24, C12, which extracts the average value; on this capacitor C12 the DC control voltage of the flyback converter 16 is equal to D*V_micro.

Lastly, the microcontroller 15 manages a serial communication interface with TTL levels connected to the connector J4 (port CN1) for communicating with the devices outside the power supply 10.

The circuit for measuring the luminosity, consisting of IC2B and auxiliary components, is described in other patent documents in the name of the same Applicant and comprises a single ramp convertor, controlled by the microcontroller 15 by means of the START_MEAS_FOTORIC pin and the output of the comparator IC2B, advantageously designed for reading with a wide dynamic the weak electric current generated by the light sensor 19 connected to the connector J7 (port CN2).

Figure 4:
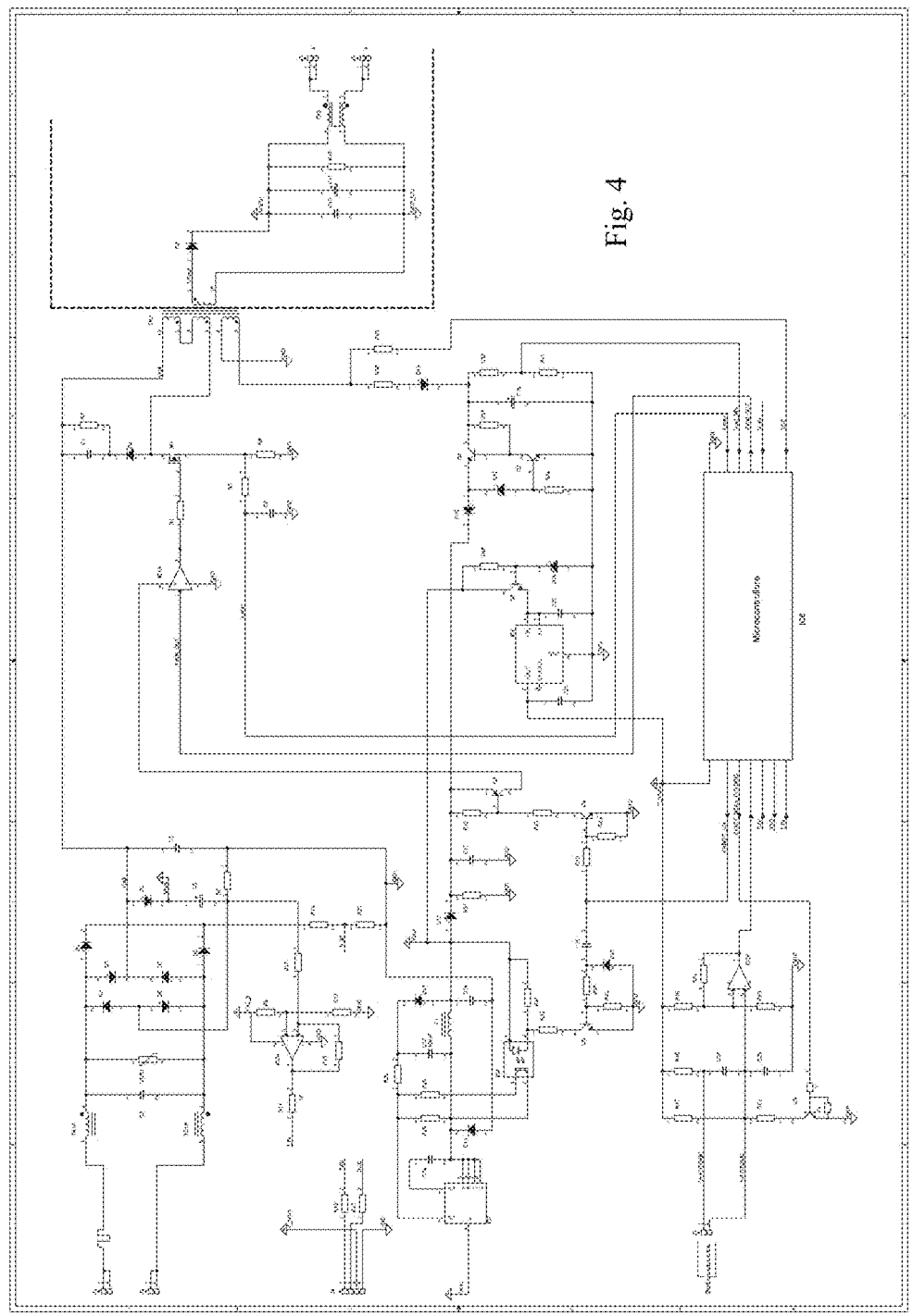
FIG. 4 shows a circuit diagram of the multifunction electronic power supply for LED lighting appliances, according to the invention, alternative to that illustrated in FIG. 3.

FIG. 4 illustrates a basic circuit diagram of the multifunction electronic power supply according to this invention as shown in FIG. 1, according to an alternative embodiment to that illustrated in FIG. 3.

This second embodiment is identical to the first version, except for control of the flyback converter 16, which is performed completely digitally.

Moreover, the MOSFET power transistor M1 is driven directly from the microcontroller 15, by means of the IC1A level adapter buffer and the flyback converter 16 is driven, pulse by pulse, directly from the microcontroller 15, which directly generates the high frequency modulating law on the relative PWM_OUT pin.

The operation of all the other circuit blocks is identical to the first embodiment shown in FIG. 3.

With regard, in particular, to the operation of the flyback converter 16, the microcontroller 15, in the fully digital solution, synchronizes on the positive network sinusoidal arcs measured using the divider R14, R23.

The control of the flyback converter 16 is achieved with the constant Ton technique, in "boundary mode", which produces by construction a sinusoidal absorption from the mains power supply 13, whilst the Toff is governed by the ZCD pin, which synchronizes the digital Ton generator inside the microcontroller 15, with the condition of annulling the magnetic flow in the transformer TR2, thereby enabling the switching ON again of M1.

The value of Ton is determined by the microcontroller 15 as a function of the desired light intensity and, therefore, as a function of the power of the flyback 16, which is determined by the amplitude of Ton.

The I_max signal is connected to an internal comparator in the microcontroller 15, which "sets" an internal flip-flop if the maximum current threshold set relative to the drain of the power MOSFET M1 is exceeded, blocking the PWM_OUT signal and, consequently, the flyback converter 16, as safety protection.

The phase correction function, which is necessary in order to limit the increase in the frequency of operation of the flyback converter 16 under low load and high input voltage conditions, is achieved, in this second version of the power supply 10, with logic networks micro-programmed inside the microcontroller 15.

Figure 5:
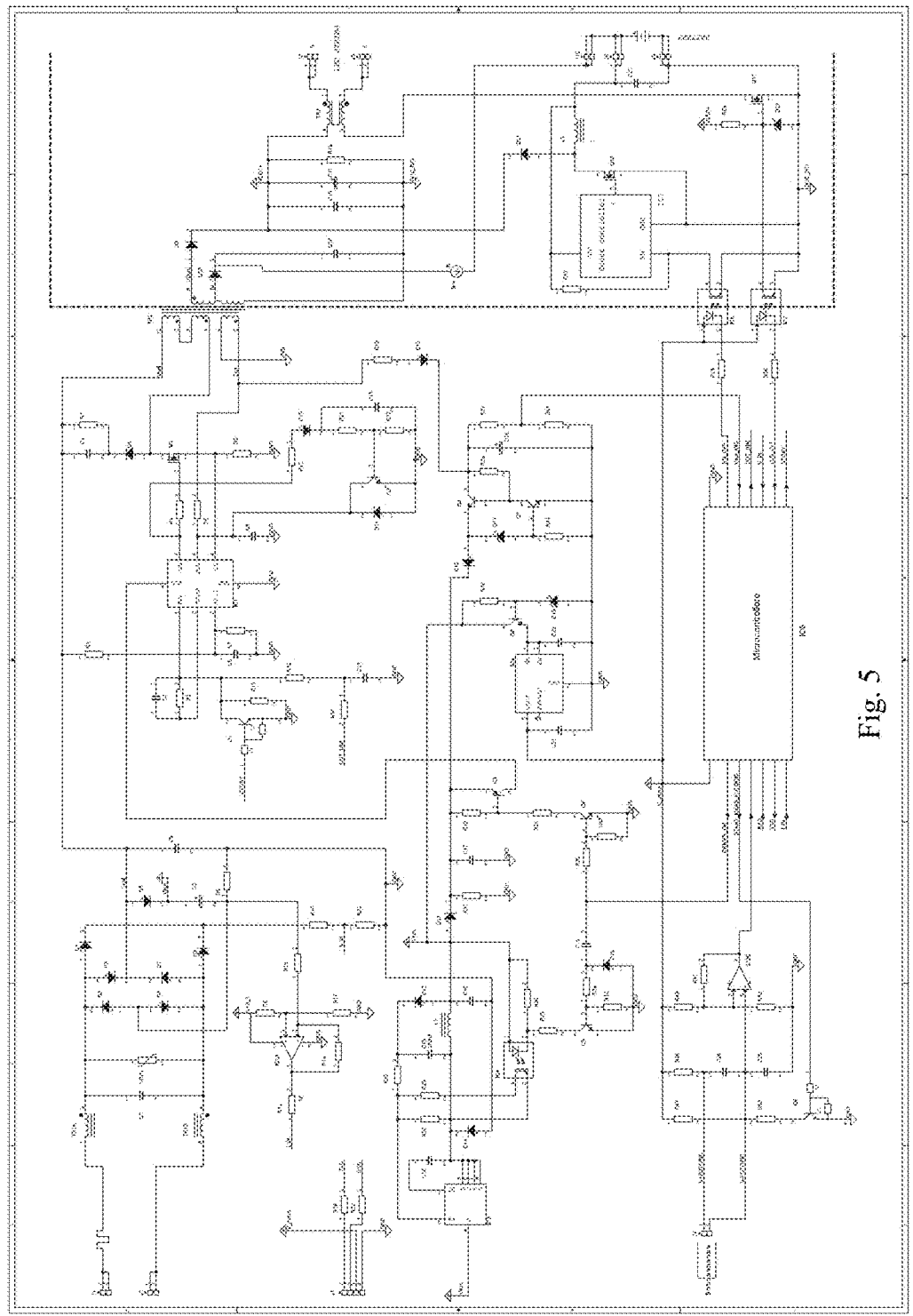
FIG. 5 shows a circuit diagram of the multifunction electronic power supply for LED lighting appliances of FIG. 2, according to the invention.

FIG. 5 illustrates a main circuit diagram of the power supply according to this invention set up for the emergency lighting function, as described and illustrated with reference to the block diagram of FIG. 2.

This further embodiment is identical to the version of FIG. 3 with regard to the operation of the normal lighting.

Moreover, the port CN4 (J8, J9 and J10 of FIG. 5) is set up for connection of the emergency battery 21, which is drawn already connected in the circuit of FIG. 5.

If the battery 21 is connected to the CN4 port, in the absence of mains power supply on the input power supply terminal (J1, J2), all the part of the power supply upstream of the isolation barrier is switched OFF and the boost converter comprised by IC7, Q10, L3 and D21 activates, increasing the battery voltage to the correct level for polarising the string of LEDs of the light source 20, which are connected to the port CN3 (J3, J5), switching them ON.

If the battery 21 is not connected to port CN4 the product behaves exactly as in the basic circuit diagram of FIG. 3.

More specifically, the absence of the connection of the battery 21 leaves the two terminals J8 and J10 isolated, separating the circuit for charging the battery 21 consisting of the current limiting device 11, which connects to J10, from the circuit of the boost converter which connects to J8; this guarantees the absence of false operations caused by interference of the two circuits in the absence of the battery 21.

The two opto-isolators IC6 and IC7, activated by the microcontroller 15, completely govern the operation of the emergency lighting part; in particular, the microcontroller 15 controls the operation in the following manner.

In the case of presence of a 230V AC mains power supply, there can be two possible statuses, as a function of the actuation commands received from the CN1 port:
1. light source 20 or light switched ON;
2. light source 20 or light switched OFF.

In the first case (light switched ON) the flyback converter 16 is driven to the power necessary to switch ON the output LEDs of the light source 20 and the microcontroller 15 also switches ON the opto-isolator IC7 to guarantee the switching ON of the output string of LEDs; in this state, the battery 21, which may be connected, charges from the low voltage auxiliary output of TR2 rectified by D20, by means of the current limiting device 11.

In the second case (light switched OFF), the opto-isolator IC7 is switched OFF and the flyback converter 16 is controlled by the microcontroller 15 at reduced power, in order to provide the auxiliary output of TR2 (D20) with the necessary current for charging the battery 21.

If the battery 21 is not connected, the microcontroller 15, after detecting a voltage Vout_mis which is too high, switches OFF the flyback converter 16 returning the operation of the power supply 10 to that of the first version of FIG. 3.

The boost controller 23, which forms part of the control circuits 22 of the emergency lighting function, may made with a low cost microcontroller; in that case, the operation may be very simple and the drive of the MOSFET may occur with a predetermined constant duty-cycle, if necessary compensating for the voltage variations of the battery 21.

In effect, the output voltage is defined by the string of LEDs of the light source 20 connected to the output and the current is determined by the duty-cycle set up.

The microcontroller used for the IC7, measuring the voltage of the battery 21 (VDD), is able to automatically switch OFF below a pre-set threshold, protecting battery 21 from draining.

The operation of the multifunction electronic power supply for LED lighting appliances, according to the invention, is substantially as follows.

The microcontroller 15 implements a synchronous state machine with the period of the mains power supply 13.

The synchronism is carried out with a digital PLL coupled to the mains power supply 13 sampled by the V_IN pin of the microcontroller 15.

The sampling period of the electrical quantities V and I is synchronised by the state based machine and occurs approximately every 625 µs; so, every 625 µs the microcontroller 15 carries out the following:
  samples the quantities V and I as close together as possible;
  calculates the electrical power absorbed by the network and integrates this value in a permanent counter of the electricity consumed by the electronic power supply 10 during its life;
  applies the value of PWM calculated by the automation device (which generates the OUT_DIM signal or the PWM_OUT signal); the actuation of the PWM to each sample allows dithering techniques to be applied on the PWM, increasing the resolution up to 18 bits.

The state based machine comprises the following automation devices:

timer; this generates the time details necessary for operation of the various automation devices (FLAG_1S, FLAG_1MIN, etc.); in particular, for measuring the energy, at every new sample, it multiples V and I and adds the product in the specific counter, then, every 10 ms, it calculates, starting from the previous counter, the instantaneous power relative to the 10 ms passed, and every 10 ms it calculates, starting from the samples, further samples relative to the network half-cycle which has just passed (mains supply presence/absence, AC/DC network, etc.);

filtering inputs; every 10 ms it compares the values of the samples derived from the previous automation device with the filtered values and every 50 ms it generates the new filtered details of the network signals;

auto-calibration; if the function is enabled, once every hour the microcontroller 15 carries out the auto-calibration function moving to 100% and 90% of the relative set-point, measuring at those points the light intensity by means of light sensor 19 and estimating the hypothetical intensity at 110% of the set-point; this value, opportunely filtered and averaged, constitutes the light set-point to aim at if the auto-dimmer function is active;

light sensor measurement; the microcontroller 15 continuously samples the measurement provided by the light sensor 19 discharging the measurement capacitor and setting to zero the time counter and, therefore, measuring the time necessary for the voltage value to which the charged capacitor changes to exceed the threshold set on a comparator, thereby lowering the logic level of the port of the microcontroller 15. In this way, the time measured decreases with the increase in the intensity of light seen by the sensor 19 and constitutes a measurement relative to the intensity of the light itself; this value, opportunely averaged, is compared with the calibration value stored in the permanent memory and, on the basis of the comparison, the power on the LEDs of the light source 20 is increased or decreased (if necessary), so as to keep the lighting level measured constantly above the night time lighting level, with variations to the contribution of daytime light and/or the reflection beneath the LED light source 20;

regulating algorithm (autodimmer); the power supply regulates with an autodimmer function as the default setting; the algorithm compares, every 10 ms, the averaged value of the light sensor 19 with the calibration value permanently stored in the permanent memory and, if the light value read falls within a range around the set-point (stability band), the power of the light source 20 is not modified, in order to avoid continuous modifications to the light intensity of the light source 20, which could prove to be annoying; if, however, the value of light read is significantly higher or lower than the set-point, the power of the light source 20 is reduced or increased accordingly in an infinitesimal manner ($1/128$ W every 10 ms) until returning within the stability band;

power regulating algorithm; the power supply regulates in terms of power (with the PI algorithm described below) following receipt of a specific command; in practice, every 10 ms, on the basis of the instantaneous power measurement calculated in the previous 10 ms, the error is calculated relative to the desired power set-point and the error is added in a variable (integrator). Error and integrator, suitably multiplied according to the relative dynamic constants of the feedback control constitute the basis for calculation of the new value of the output variable PWM; this variable is recalculated and reapplied on the output pin every 10 ms, but its value is maintained with a suitable number of significant digits, which allow, in reality, an actuation dithering to be performed for every sample (625 µs); this increases the resolution of the PWM from the 10 native bits present on the microcontroller 15 to 18 bits; the time constant of the dynamic implemented is about 100 ms. It is possible, with a specific command, to vary the power by setting the target power and the time in which it is to be reached and the microcontroller 15 carries out a linear ramp varying the power with a resolution of $1/128$ W every 10 ms. Also in this case, in order to guarantee the precision of the actuation time, a dithering is performed on the number of power steps applied every 10 ms;

serial interface (CN1 port); the serial interface is managed with full-duplex auto-baud mode, which allows the interfacing with isolated serial modules or with radio interfaces 18;

derating of power as a function of the temperature; the microcontroller 15 is equipped with an internal temperature sensor, which, suitably calibrated in the factory, allows a power derating to be implemented when a temperature threshold is exceeded. The derating is linear with the increase in temperature, up to a maximum power reduction, which is normally set at 80% of the nominal value; in this way the reliability of the power supply 10 is maintained, which auto-reduces the power if the temperatures in question are too high;

determination of the quantity of LEDs present in output and corresponding determination of the power; the microcontroller 15 reads the voltage reflected by the transformer TR2 to automatically determine the length of the string of LEDs connected to the light source 20. In fact, each power supply 10 is characterized by the relative output current and it auto-adapts for driving the string of LEDs connected, then regulating the power; in order to determine which power value to fix, the power supply 10, when it is first switched ON, reads the voltage present and, on the basis of this value and knowing the relative current, determines the regulating power (for example, if the power supply 10 is 1 A, with a value of 30V the power supply 10 must regulate to 30 W, whilst with a value of 60V it must regulate to approximately 60 W). The microcontroller 15 therefore automatically determines the output power adapting to the string of LEDs connected.

The technical features of the multifunction electronic power supply for LED lighting appliances according to this invention clearly emerge from the description, as do the advantages thereof.

Lastly, it is clear that numerous other variants might be made to the multifunction electronic power supply in question, without forsaking the principles of novelty of the inventive idea, while it is clear that in the practical actuation of the invention, the materials, the shapes and the dimensions of the illustrated details can be of any type according to requirements, and can be replaced by other technically equivalent elements.

The invention claimed is:
1. A multifunction electronic power supply for LED lighting appliances, comprising:

a plurality of interface connectors, an I/V filtering and measuring block which is connected to a main power supply, an auxiliary power supply, a microcontroller, a fly-back converter having an isolated output and a circuit for measuring a brightness of the LED lighting appliances, said plurality of interface connectors being connected, respectively, to an analog interface module or to a bus interface module or to a digital radio transceiver, equipped with a camera for taking images, or to a sensor for detecting movement or presence of persons, as well as to a light sensor, which detects light reflected from a floor and from objects and/or people present in an area which is illuminated by said LED lighting appliances, and to a LED light source of the LED lighting appliances, which spreads light in an environment and which is driven by said multifunction electronic power supply, in order to adjust a given power of said LED lighting appliances as a function of measured reflected light, wherein said multifunction electronic power supply is configured, via an interface connector and said microcontroller, during an assembly phase of said multifunction electronic power supply inside said LED lighting appliances, so that each multifunction electronic power supply is configured for each different type of lighting appliance when said LED lighting appliances are built;

wherein said fly-back converter is controlled by said microcontroller and includes a power MOSFET, an output diode, a transformer and a controller, equipped with a plurality of auxiliary passive components, with a snubber network and a phase correction network.

2. The multifunction electronic power supply as claimed in claim 1, wherein said multifunction electronic power supply is configured to measure power absorbed by said main power supply and to measure energy expended by said LED lighting appliances, said measure being provided as an internal counting parameter and being provided by at least one of said plurality of interface connectors.

3. The multifunction electronic power supply as claimed in claim 1, wherein one of said plurality of interface connectors is connected to a battery, which is configured to activate an emergency lighting status of said LED light source, by control circuits of said LED light source.

4. The multifunction electronic power supply as claimed in claim 3, wherein said multifunction electronic power supply is permanently connected to the main power supply and said LED light source is turned on and off by means of a first interface connector, through said digital radio transceiver or by said bus interface module, said LED light source being so controlled by a user through a logic command sent to said multifunction electronic power supply.

5. The multifunction electronic power supply as claimed in claim 4, wherein it includes at least two opto-isolators, which are driven by said microcontroller and which control the emergency lighting status as a function of the status of said LED light source and as a function of actuation commands received from said first interface connector.

6. The multifunction electronic power supply as claimed in claim 1, wherein said fly-back converter is digitally controlled and is driven, pulse by pulse, directly from said microcontroller, which directly provides a HF modulation.

7. The multifunction electronic power supply as claimed in claim 1, wherein said phase correction network is carried out with programmed logic networks provided inside said microcontroller.

8. The multifunction electronic power supply according to claim 1, wherein said microcontroller is configured to achieve a state machine which is synchronous with a period of said main power supply, by a digital PLL that is coupled with a main voltage, said microcontroller being able to periodically sample an electric voltage and an electric current with a period synchronized by said state machine.

9. The multifunction electronic power supply as claimed in claim 8, wherein said state machine is composed of a timer, which generates indications of time for operating different automata, an inputs filtering device, an auto-calibration device for controlling a light intensity of said LED light source, a measurement device coupled with said light sensor, an algorithm for adjusting the light intensity, an algorithm for adjusting lighting power, at least one serial interface which is configured to interface isolated serial modules or radio interfaces, a power derating algorithm as a function of temperature, a device for detecting a number of LEDs provided in said light source and for detecting an output-emitted light power.

* * * * *